United States Patent [19]
Dahmen et al.

[11] 3,970,487
[45] July 20, 1976

[54] METHOD OF MANUFACTURING A POWER TRANSISTOR

[75] Inventors: Manfred Dahmen, Gaeufelden-Oeschelbronn; Anneliese Ritzhaupt, Boeblingen; Manfred Zurheide, Gaeufelden-Oeschelbronn, all of Germany

[73] Assignee: International Business Machines Corporation, Armonk, N.Y.

[22] Filed: June 16, 1975

[21] Appl. No.: 589,276

[30] Foreign Application Priority Data
Sept. 24, 1974 Germany.............................. 2445480

[52] U.S. Cl.............................. 148/187; 29/576 R; 148/1.5; 148/175; 156/17
[51] Int. Cl.²........................................ H01L 21/302
[58] Field of Search.................... 148/1.5, 175, 187; 156/17; 29/276

[56] References Cited
UNITED STATES PATENTS
3,678,573 7/1972 Driver............................ 148/187 X
3,755,001 8/1973 Kool et al. ........................ 148/1.5
3,806,361 4/1974 Lehner............................ 148/175 X

*Primary Examiner*—L. Dewayne Rutledge
*Assistant Examiner*—J. M. Davis
*Attorney, Agent, or Firm*—Robert J. Haase

[57] ABSTRACT

A method for manufacturing a power transistor having a highly doped emitter zone and a narrow base zone with a flat doping profile.

In a long-term diffusion step ensuring the flat doping profile, the base zone is diffused into a lowly doped substrate serving as a collector. In a subsequent etching process, the base zone is etched down to a shell-shaped remainder. A large area, highly doped emitter zone with a steep doping profile and thus a high emitter efficiency is introduced into this shell-shaped remainder in a short-term diffusion step.

8 Claims, 4 Drawing Figures

METHOD OF MANUFACTURING A POWER TRANSISTOR

BACKGROUND OF THE INVENTION

The term power transistor refers to all those types of transistors which at a high current and a high voltage emit a high power on the collector side.

These requirements are coupled with several conditions which cannot be readily met by the usual planar technological methods used to manufacture power transistors.

A first condition to be met during the manufacture of a power transistor is a high backward voltage collector-base junction. A high backward voltage collector-base junction necessitates a flat doping profile of the base zone. When the usual methods are applied a flat doping profile of the base is obtained by producing the base in a long-term diffusion step. This long-term diffusion leads to a relatively deep base zone. However, the frequency limit of a transistor is essentially a function of the base width and the capacity of the collector depletion layer. In order to achieve a base width which is small with regard to the high-frequency characteristic, it is essential to have a deep emitter zone because of the deep base zone necessary to ensure a flat doping profile. This second condition, however, runs contrary to a third condition a power transistor structure is expected to meet. This third condition arises from the necessity to have a high emitter efficiency. A high emitter efficiency, as is known, can be achieved by selecting a large area emitter zone in connection with a high doping and a steep emitter doping profile, respectively.

A large area emitter zone produces the so-called current density effect. In a transistor with a circular emitter and a base terminal surrounding the latter in the form of a circular ring the current paths extend from the base contact below the emitter to the emitter depletion layer. As the base zone has a relatively low doping it has a relatively high transverse resistance. This, in turn, leads to a voltage drop from the emitter periphery towards the center of the emitter area and thus from the periphery in a radial direction to a decrease in the forward voltage of the emitter depletion layer. At higher currents this effect becomes noticeable in that the injection decreases substantially in the direction of the center of the emitter area, thus limiting the emitter current. At the current densities desirable for power transistors and at high voltages the current density leads to a current or a voltage limitation. A solution of this problem is known from German Pat. No. 1,281,036, for example, according to which the emitter zone is screen-shaped, so that parts of the base zone can engage the apertures of the screen-shaped emitter zone. While eliminating the current density effect this ensures an increase in the emitter circumference/emitter area ratio and thus a relatively high emitter current density.

However, the further problem of having a highly doped emitter zone in planar technology close to the collector-base junction in order to reduce the base width to a minimum is extremely difficult to solve where a deep base diffusion is necessary to ensure a flat base profile. The reason for this is that the great depth of the collector-base junction necessitates a very long emitter diffusion step, which considerably reduces the efficiency of the emitter. Apart from this, it is necessary in most cases to provide for very thick masking oxide layers or other masking layers as emitter diffusion masks.

SUMMARY OF THE INVENTION

It is the object of the invention to provide a power transistor with a high collector-base backward voltage and a high emitter efficiency, whereby the drop in the current amplificaton at high currents is essentially reduced.

The invention is characterized in that the base zone of a second conductivity type is introduced into a first conductivity type substrate forming the collector zone, that in an etching process the base zone is etched down to a shell-shaped remainder, that the highly doped emitter zone is subsequently introduced into this remainder, and that finally the individual zones are contacted.

The steep emitter doping profile thus obtained ensures a high emitter efficiency and thus a current amplification even at high collector currents. Because of the short emitter diffusion time no particularly thick oxide layers are required for masking.

BRIEF DESCRIPTION OF THE DRAWING

One favorable embodiment of the method in accordance with the invention will be described in detail below by means of drawings of which

DESCRIPTION OF THE PREFERRED EMBODIMENT

Figure 1:
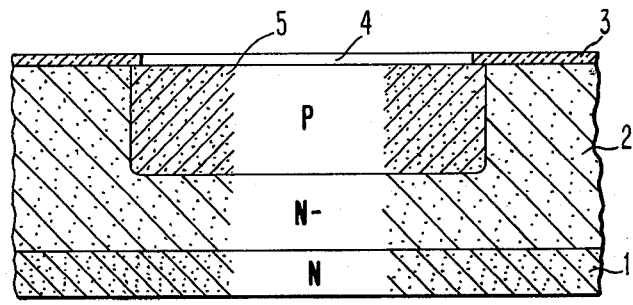
FIG. 1 is a sectional view of the transistor structure after base diffusion.

In the embodiment described the basic material used is a silicon antimony N-doped substrate 1 (wafer). The substrate has a specific resistance of, for example, 0.004 – 0.016 ohm/cm. The substrate is initially cleaned in several baths. Subsequently, an N$^-$ conductive semiconductor layer 2 is applied to the surface of substrate 1 in an epitaxial process, using $H_2$, $SiCl_4$, $AsH_3$, and argon at a temperature of about 1150°C. In the example described the process parameters are such that the layer has a specific resistance of about 30 ohm.cm and a thickness of about 70 μm. After a further cleaning process a silicon dioxide layer 3 is thermally applied to the surface of epitaxial layer 2. The thickness of the silicon dioxide layer is, for example, 10 × 10$^3$ A. After a photo-etching step base window 4 for diffusing the base zone is opened in this silicon dioxide layer in a known manner. In a capsule diffusion step, using boron as an impurity material, a P conductive base zone 5 is diffused into epitaxial layer 2. Diffusion is carried out as a long-term diffusion, so that a relatively deep base zone with a flat doping profile is obtained. In the example described the depth of the base zone is 22 μm. After these process steps have been performed the structure shown in FIG. 1 is obtained.

In a reoxidation process base window 4 is closed by a silicon dioxide layer. This silicon dioxide layer is designated as 6 in FIG. 2 which will be described below. In a further photo-etching step an etch window 7 is opened in silicon dioxide layer 6. This etch window 7 is so aligned to base zone 5 that in a subsequent etching step the base zone can be etched down to a shell-shaped remainder. In the preferred embodiment the design of the etching mask is such that the latter can additionally be used as a diffusion mask for diffusing the emitter zone.

Figure 2:
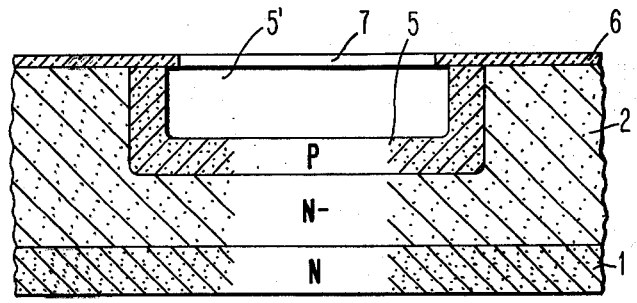
FIG. 2 is a sectional view of the transistor structure after etching.

Subsequently, base zone 5 is etched in the area of window 7. The etching process is controlled in such a manner that only a relatively thin shell-shaped remainder is left over. After completion of the etching process the structure shown in FIG. 2 is obtained. This structure is characterized in that the central area 5' of base zone 5 is removed. The depth of the etched area is about 8 μm. The etching step in accordance with the invention ensures that the shell-shaped remainder of base zone 5 has a flat doping profile which is necessary for a collector-base junction with a high backward voltage.

Figure 3:
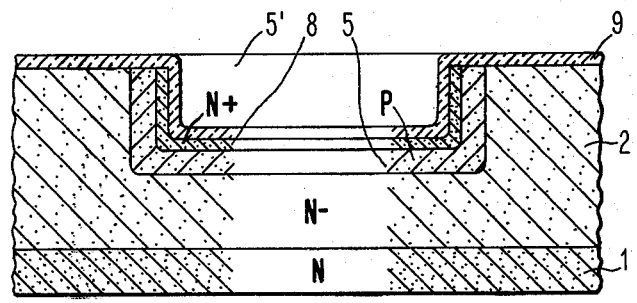
FIG. 3 is a sectional view of the transistor structure after emitter diffusion.

After yet a further cleaning process emitter zone 8 is diffused into base zone 5 in etch window 7 which is used as a diffusion window. Diffusion is carried out as a short-term diffusion, using an extremely high phosphorus doping rate, so that an $N^+$ doped emitter zone 8 is produced within the P doped base zone 5. In the example described the thickness of emitter zone 8 is about 2 μm. The high doping rate and the large area of the emitter zone ensure the high emitter efficiency required. In accordance with FIG. 3, a further silicon dioxide layer 9 is applied in a reoxidation process.

The further process steps used to complete the power transistor are conventional ones and essentially serve to contact and connect the semiconductor zones and to externally protect the transistor.

Figure 4:
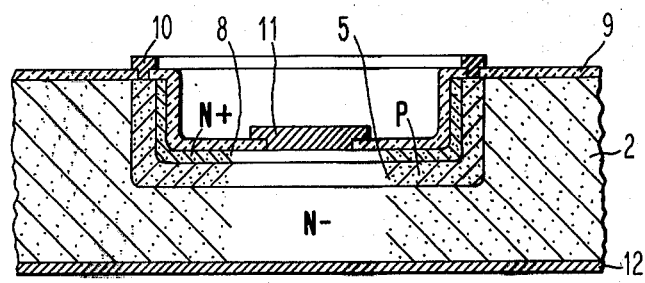
FIG. 4 is a sectional view of the transistor structure after contacting.

A contacting example of the base zone, the emitter zone and the collector zone is shown in FIG. 4.

Initially, contact windows are opened in silicon dioxide layer 9 in the area of contacts 10 and 11 to be formed, using the known photo-etching steps. During this process, the contact window for the $N^+$ doped emitter zone 8 is opened preferably centrally within the shell-shaped recess 5'. The contact window for the P doped base zone 5 is located on the surfacial periphery of the shell-shaped base zone 5. In the case of an axial symmetric design of the structure, the base window can annularly surround the emitter zone. With other designs the base contact has to be adapted accordingly. After completion of the etching process for the contact windows an Al/Cu metal layer is vapor deposited on the whole surface. Then an etching mask is applied, and the areas of the metal layer not required for contacting the base and emitter zone are removed by etching. In this manner the contacts — base contact 10 and emitter contact 11 — shown in FIG. 4 are obtained. These contacts more or less overlap silicon dioxide layer 9, so that a large contact area suitable for connection is obtained. After a sintering step in which the properties of the contacts are improved, a quartz layer is cathode sputtered on to the whole surface. This quartz layer is not shown in FIG. 4. Through-holes for the base and emitter contact 10 and 11, respectively, are opened in this quartz layer in a further photo-etching step. By means of a further metallization, the contacts are connected via these through-holes. This metallization is performed in a masked vapor deposition step. To this end Cr-Cu-Au and subsequently Pb/Sn is vapor deposited.

In a chemical/mechanical etching or grinding and polishing step, the thickness of the wafer is reduced from the rear of about 200 μm. For contacting the N doped epitaxial layer 2 forming the power transistor, a metal layer 12 of Ni, Cr-Cu-Au and finally of Pb/Sn is vapor deposited on the rear side of the wafer after a cleaning process.

The requirements to be fulfilled with regard to the characteristics of a power transistor are best met by the method in accordance with the invention. The long-term diffusion of the base ensures that the flat doping profile of the base zone leads to a high backward voltage collector-base junction. Etching the base zone down to a relatively thin remainder in accordance with the invention permits a large area, highly doped emitter zone with a steep doping profile being introduced into the base zone in a short-term diffusion step. The large area of the emitter zone and the high doping rate ensure the high emitter efficiency required. At the same time, a small base width necessary with regard to the high-frequency characteristic is obtained.

A further development of the described embodiment which is advantageous with regard to the above-mentioned current density effect is characterized in that no continuous emitter zone is introduced into the shell-shaped remainder of the base zone but that by means of a special diffusion mask comprising several separate diffusion windows an emitter zone subdivided into several individual areas is produced. Each of these individual emitter areas is to be provided with an emitter contact. All emitter contacts are to be connected to a common emitter terminal. Otherwise the method of manufacturing this particular embodiment is identical to the methods described in connection with FIGS. 1 to 4.

A further embodiment of the power transistor in accordance with the invention which is considerably improved with regard to the current density effect is obtained by modifying the described method in such a manner that a screen-type mask with continuous windows is used. This leads to a continuous, screen-type emitter zone being formed in the base zone, the latter engaging the screens of the emitter zone. Also the method used for this embodiment is identical to those described in connection with FIGS. 1 to 4, the only difference between the former and the latter methods being that a special correspondingly designed emitter diffusion mask is used. The special design of the emitter zones in the last two embodiments ensures that even at higher current densities and voltages a current or voltage limitation is largely avoided.

While the invention has been particularly shown and described with reference to the preferred embodiments thereof, it will be understood by those skilled in the art that various changes in form and details may be made therein without departing from the spirit and scope of the invention.

What is claimed is:

1. The method of manufacturing a planar power transistor having a highly doped emitter zone, a base zone with a flat doping profile, and a collector zone in a first conductivity type substrate, wherein the improvement comprises:
   forming said base zone by introducing a second opposite conductivity type impurity into said substrate,
   etching said base zone down to a shell-shaped remainder,
   forming said highly doped emitter zone by introducing first conductivity type impurity into said base zone remainder and forming contacts to the individual zones of said transistor.

2. The method in accordance with claim 1, wherein said emitter zone is formed by diffusion.

3. The method in accordance with claim 2, wherein said base zone is etched using an etching mask and said emitter zone is formed by diffusion using said etching mask.

4. The method in accordance with claim 1 wherein said base zone is introduced in a long-term diffusion step.

5. The method in accordance with claim 4, wherein said emitter zone is introduced in a short-term diffusion.

6. The method in accordance with claim 5, wherein said base zone is etched using an etching mask and said emitter zone is formed by diffusion using said etching mask.

7. The method in accordance with claim 1, wherein said emitter zone is formed as a multi-emitter structure and the individual emitter areas are jointly connected to a common emitter terminal.

8. The method in accordance with claim 1, wherein said emitter zone is formed as a continuous screen type emitter zone.

* * * * *